United States Patent

Clampitt

[11] Patent Number: 5,932,928
[45] Date of Patent: Aug. 3, 1999

[54] SEMICONDUCTOR CIRCUIT INTERCONNECTIONS AND METHODS OF MAKING SUCH INTERCONNECTIONS

[75] Inventor: Darwin A. Clampitt, Boise, Id.

[73] Assignee: Micron Technology, Inc., Boise, Id.

[21] Appl. No.: 08/887,801

[22] Filed: Jul. 3, 1997

[51] Int. Cl.⁶ .................................................. H01L 23/52
[52] U.S. Cl. .................... 257/758; 257/750; 257/773; 438/622; 438/637; 438/638; 438/675
[58] Field of Search ....................... 257/773, 750, 257/211, 751, 763, 758, 774; 438/622, 637, 638, 675, 618

[56] References Cited

U.S. PATENT DOCUMENTS

| 4,789,648 | 12/1988 | Chow et al. | 438/633 |
|---|---|---|---|
| 5,200,807 | 4/1993 | Eguchi | 257/758 |
| 5,341,026 | 8/1994 | Harada et al. | 257/764 |
| 5,380,679 | 1/1995 | Kano | 438/628 |
| 5,466,639 | 11/1995 | Ireland | 438/633 |
| 5,471,091 | 11/1995 | Pasch et al. | 257/752 |
| 5,471,093 | 11/1995 | Cheung | 257/758 |
| 5,602,423 | 2/1997 | Jain | 257/752 |
| 5,612,254 | 3/1997 | Mu et al. | 438/634 |
| 5,691,574 | 11/1997 | Suzuki | 257/758 |

Primary Examiner—Valencia Martin-Wallace
Assistant Examiner—George C. Eckert, II
Attorney, Agent, or Firm—Killworth, Gottman, Hagan & Schaeff, L.L.P.

[57] ABSTRACT

Interconnections to a semiconductor structure are formed by alternating ribs and contact lines which are substantially orthogonal to each other and separated from one another in two dimensions. Each contact line is connected to conductive contacts which extend through an insulation layer. The ribs, conductive contacts and contact lines are produced from a conductive layer formed over the insulation layer after the insulation layer has been masked and etched. The ribs are isolated from the contact lines and connected conductive contacts by etching the ribs to a depth below the surface of the insulation layer upon which the contact lines are located. The ribs and conductive contacts can be formed over conductive plugs which are preformed through an insulation layer formed over the semiconductor structure. The ribs, conductive contacts and conductive plugs can also be formed together. A mask is formed between bottom and top insulating layers to locate the conductive plugs. The top insulation layer is masked and etched to form the trenches and contact openings with openings through the bottom insulation layer being etched through the mask which prevents the bottom insulation layer from being etched other than to form openings for the conductive plugs. A layer of conductive material is then formed to fill the conducive plug openings, corresponding openings in the mask, the trenches and contact openings.

26 Claims, 4 Drawing Sheets

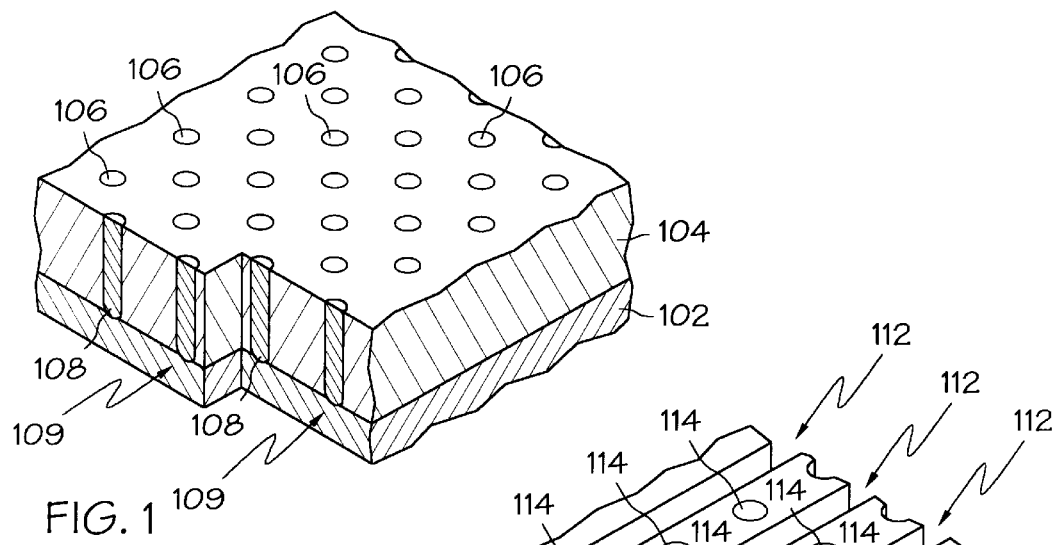
FIG. 1
FIG. 2
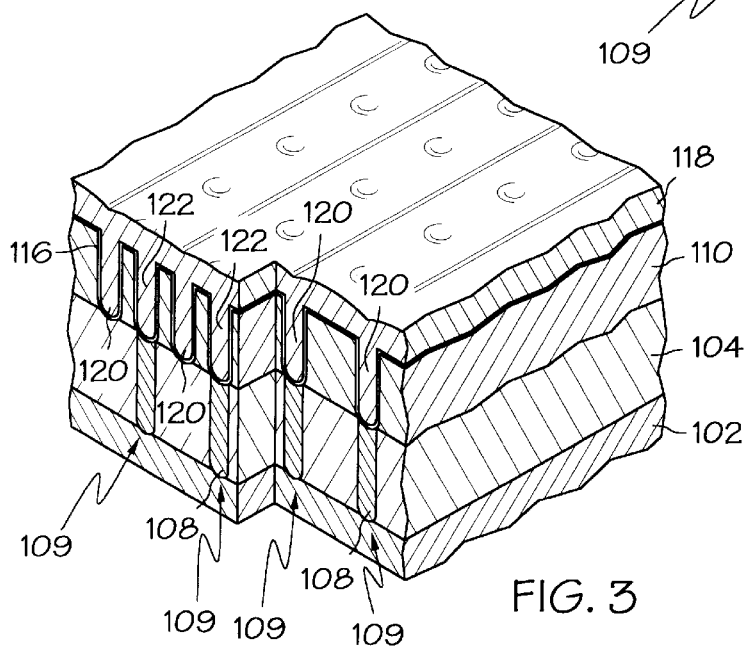
FIG. 3

US 5,932,928

SEMICONDUCTOR CIRCUIT INTERCONNECTIONS AND METHODS OF MAKING SUCH INTERCONNECTIONS

BACKGROUND OF THE INVENTION

The present invention relates in general to semiconductor circuits and, more particularly, to interconnections within semiconductor circuits and methods of making the interconnections to have low resistance, reduced cross coupling and occupy reduced surface area.

A semiconductor circuit includes an array of devices which are interconnected by patterns of wiring lines formed of conductive material. As the devices are scaled to smaller and smaller dimensions, formation of reliable interconnects becomes more and more difficult since the wiring lines need to be formed to occupy less space. To this end, the wiring lines are reduced in width, but eventually they become so narrow that to reduce them further results in resistance levels of the lines being too great for reliable operation of the semiconductor circuit. Similarly, the spaces between the lines are reduced in width, but there is a minimum allowable spacing beyond which the coupling between the lines becomes too great for reliable operation of the semiconductor circuit.

To get around the problems of further reducing the width and spacing for wiring lines, the depth of the lines have been increased. A method of increasing the depth of the wiring lines is known as a damascene process named after the inlaid metal technique used in ancient Damascus to decorate swords and the like. In the damascene process, a series of channels are etched into a generally planar insulation layer and a layer of conductive material is then formed over the insulation layer to fill the channels and form conductive ribs which are coupled to contact locations beneath the insulation layer. A planarization is then performed, for example by chemical mechanical planarization (CMP), to separate the inlaid ribs from one another.

Unfortunately, wiring lines formed by a series of ribs, which are produced, for example, by the damascene process, have increased surface areas which increase the capacitive coupling between the lines. Accordingly, this solution of providing ever smaller area wiring lines is limited.

There is, thus, a need for improved interconnections for semiconductor circuits which will allow the wiring lines defining the interconnections to be formed within smaller surface areas than can be used with even the conductive ribs which are currently being utilized.

SUMMARY OF THE INVENTION

This need is met by the methods and apparatus of the present application wherein interconnections to a semiconductor structure are formed by alternating ribs and contact lines which are substantially orthogonal to each other and separated from one another in two dimensions. In this way, adjacent surface areas are reduced and the spacing between adjacent surface areas is increased to reduce capacitive coupling between the ribs and the contact lines. Each contact line is connected to at least one conductive contact, preferably to a plurality of conductive contacts, which extends through an insulation layer. The ribs, conductive contacts and contact lines are produced from a conductive layer formed over the insulation layer after the insulation layer has been appropriately masked and etched. The ribs are isolated from the contact lines and connected conductive contacts by etching the ribs to a depth below the surface of the insulation layer upon which the contact lines reside. The depth below the surface of the insulation layer to which the tops of the ribs are etched is selected to reduce capacitive coupling between the ribs and the contact lines but to maintain sufficiently low resistances for the ribs.

The ribs and conductive contacts can be formed over conductive plugs which are preformed through an insulation layer formed over the semiconductor structure. The ribs, conductive contacts and conductive plugs can also be formed together by forming a mask between two insulating layers to locate the conductive plugs. The top insulation layer is masked and etched to form the trenches and contact openings with openings through the bottom insulation layer being etched through the mask which prevents the bottom insulation layer from being etched other than to form openings for the conductive plugs. A layer of conductive material is formed to fill the conducive plug openings, corresponding openings in the mask, the trenches and the contact openings.

It is, thus, an object of the present invention to produce semiconductor circuit interconnections which have low resistance, reduced cross coupling and occupy reduced surface area; to produce semiconductor circuit interconnections through alternating ribs and contact lines which are generally orthogonal to one another; and, to produce semiconductor circuit interconnections through alternating ribs and contact lines which are generally orthogonal to one another and are spaced from one another in two dimensions.

Other objects and advantages of the invention will be apparent from the following description, the accompanying drawings and the appended claims.

BRIEF DESCRIPTION OF THE DRAWINGS

FIGS. 1–4 illustrate a first embodiment of the present invention for contacting a semiconductor structure and, more particularly, FIG. 1 shows an isometric view of a portion of a semiconductor structure and a first insulation layer having conductive plugs extending therethrough;

FIG. 2 shows an isometric view of a second insulation layer formed over the structure of FIG. 1 with a series of trench openings alternating with contact openings and extending through the second insulation layer;

FIG. 3 shows an isometric view of a barrier layer and a conductive layer formed over the structure of FIG. 2;

FIG. 4 shows an isometric view of the structure of FIG. 3 which has been masked and etched to form conductive contact lines over conductive contacts formed in the contact openings and to isolate ribs formed in the trench openings from the conductive contact lines;

FIG. 5 shows an isometric view of a portion of a semiconductor structure, a first insulation layer and a patterned mask formed over the first insulation layer;

FIG. 6 shows an isometric view of a second insulation layer formed over the structure of FIG. 5 with a series of trench openings alternating with contact openings and extending through the second insulation layer, the patterned mask and the first insulation layer;

FIG. 7 shows an isometric view of a barrier layer and a conductive layer formed over the structure of FIG. 6; and FIG. 8 shows an isometric view of the structure of FIG. 7 which has been masked and etched to form conductive contact lines over conductive contacts formed in the contact openings and to isolate ribs formed in the trench openings from the conductive contact lines.

DETAILED DESCRIPTION OF THE INVENTION

Figure 4:
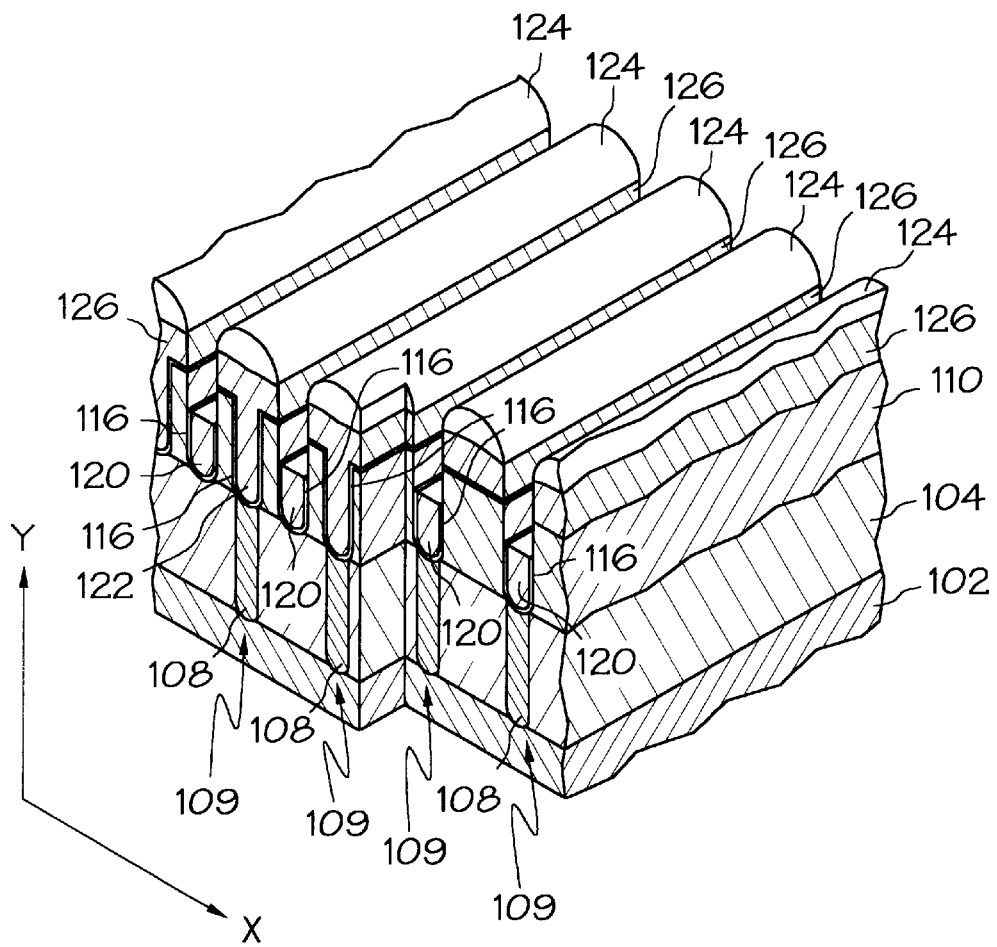

Reference will now be made to FIGS. 1–4 which illustrate a first method of the present invention for making interconnections to a semiconductor structure 102. The semiconductor structure 102 can be one or more semiconductor layers or structures and can include active or operable portions of semiconductor devices. An insulation layer 104 or first insulation layer, for example an oxide such as phosphosilicate glass (PSG) or borophosphosilicate glass (BPSG), is formed over the semiconductor structure 102 which is silicon in the illustrated embodiment.

The insulation layer 104 is masked, for example by photo resist, to define areas where contact openings 106 are to be formed. The insulation layer 104 is then etched to form the contact openings 106 which extend to the semiconductor structure 102. The mask is removed and a layer of conductive material is formed over the insulation layer 104 to fill the contact openings 106 with the conductive material and form filled conductive plugs 108. The structure is then planarized, for example by chemical mechanical polishing (CMP), to isolate the conductive plugs 108 from one another so that they then individually extend through the insulation layer 104 to locations 109 on the semiconductor structure 102 which are to be contacted.

An insulation layer 110 or second insulation layer, for example an oxide such as tetraethoxysilane (TEOS), is then formed over the insulation layer 104, see FIGS. 2–4. The insulation layer 110 is then masked, for example by photo resist, to form a patterned insulation layer having open trench patterns and open contact patterns aligned with the conductive plugs 108 and thus the contact locations 109 on the semiconductor structure 102. The patterned insulation layer is then etched to form alternating trench openings 112 and contact openings 114. As shown in FIG. 2, the trench openings 112 are separated from one another by at least one of the contact openings 114 with series of the contact openings 114 separating the trench openings 112 as illustrated.

If necessary, a barrier layer 116, such as titanium or tinitride, is formed in the trench openings 112 and the contact openings 114 as shown in FIGS. 3 and 4. A conductive layer 118 is then formed over the barrier layer 116 to fill the trench openings 112 and the contact openings 114. If the barrier layer 116 is not formed, the conductive layer 118 also fills the area illustrated as the barrier layer 116. The conductive layer 118 can be formed of chemical vapor deposition (CVD) tungsten, CVD copper, CVD aluminum or other appropriate deposited or sputtered conductive material as will be apparent to those skilled in the art. The conductive layer 118 fills the trench openings 112 to form ribs 120 therein and fills the contact openings 114 to form conductive contacts 122 therein.

A photo resist pattern 124 is formed to define conductive contact lines 126 with each of the contact lines 126 covering and interconnecting a series of conductive contacts 122. The portions of the conductive layer 118 not covered by the photo resist pattern 124 and corresponding portions of the barrier layer 116, if present, and insulation layer 110 are etched below the surface of the insulation layer 110 to isolate the ribs 120 from one another, the contact lines 126 and the contacts 122.

The etching operation is performed to a depth to reduce capacitive coupling between the ribs 120 and the contact lines 126 but to maintain sufficiently low resistances for the ribs 120. The depth of the etching operation depends on the voltage levels used for a semiconductor circuit being produced, the feature size or minimum realizable process dimension, the materials being used to make the semiconductor circuit, and process variables such that it must be determined for each semiconductor circuit being produced. Capacitive coupling is reduced by alternating the ribs 120 with the contact lines 126 and contacts 122, and etching the ribs 120 to a level below the surface of the insulation layer 110. In this way, the ribs 120 and the contact lines 126 are separated from one another both vertically, the y-direction as shown in FIG. 4, and horizontally, the x-direction as shown in FIG. 4, and are substantially orthogonal to one another reducing adjacent surface areas and increasing the spacing between adjacent surface areas.

As illustrated, the ribs 120 and contact lines 126 with their associated conductive contacts 122 are linear which is appropriate for the formation of a memory array, such as a dynamic random access memory (DRAM) for which the present invention is particularly applicable and initially being applied, and other circuits having similar layouts. However, the contacting arrangement of the present invention is generally applicable to a wide variety of semiconductor circuits wherein the ribs, conductive contacts and contact lines are formed to define contact patterns for the corresponding semiconductor circuits and would not be linear as illustrated.

A second method of the present invention for making interconnections to a semiconductor structure 140 is illustrated in FIGS. 5–8. Here again, the semiconductor 140 can be one or more semiconductor layers or structures and can include active or operable portions of semiconductor devices. An insulation layer 142 or first insulation layer, for example an oxide such as phosphosilicate glass (PSG) or borophosphosilicate glass (BPSG), is formed over the semiconductor structure 140 which is silicon in the illustrated embodiment.

Figure 5:
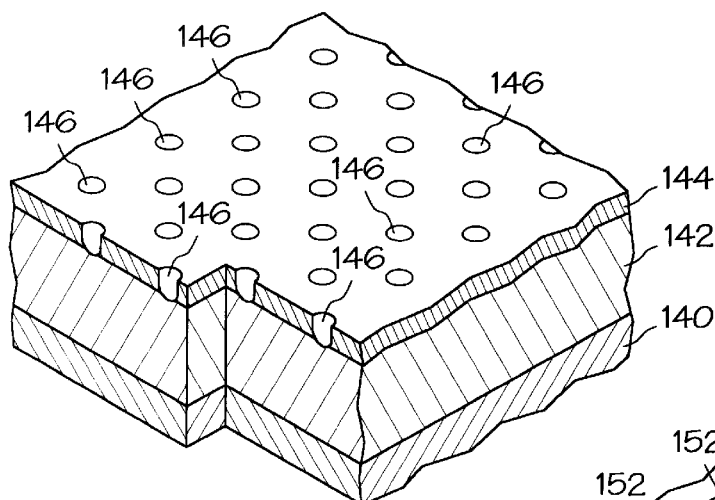
FIGS. 5–8 illustrate a second embodiment of the present invention for contacting a semiconductor structure and, more particularly.
Figure 6:
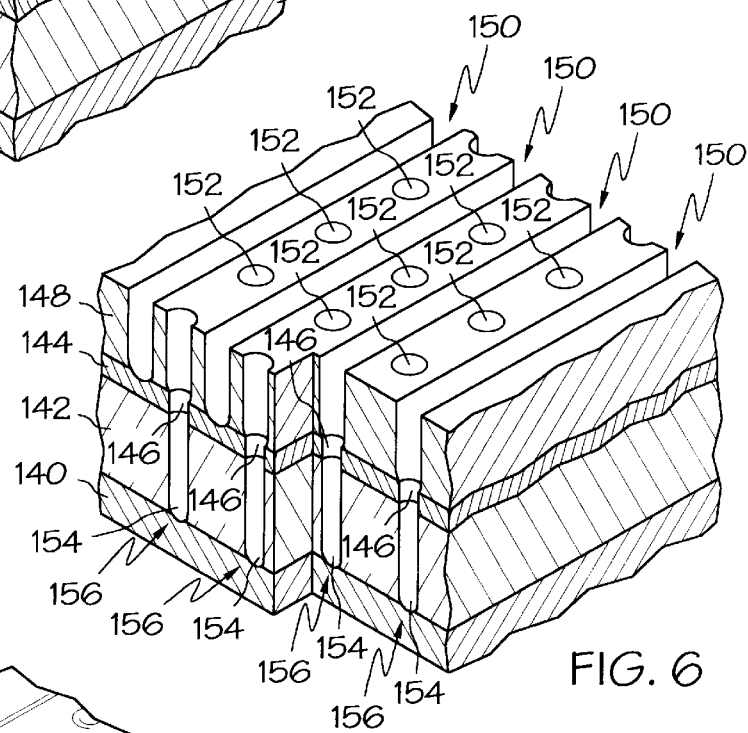

A silicon nitride layer 144 is formed over the insulation layer 142 and masked, for example by photo resist, to locate a plurality of openings 146, see FIG. 5. An etch is then performed through the nitride layer 144 and slightly into the insulation layer 142 to form a patterned mask having the openings 146 which correspond to locations of the semiconductor structure 140 to be contacted. An insulation layer 148 or second insulation layer, for example an oxide such as tetraethoxysilane (TEOS), is formed over the patterned mask formed by the nitride layer 144. A pattern, for example of photo resist, patterns columns of alternating trenches 150 and contact openings 152.

Figure 7:
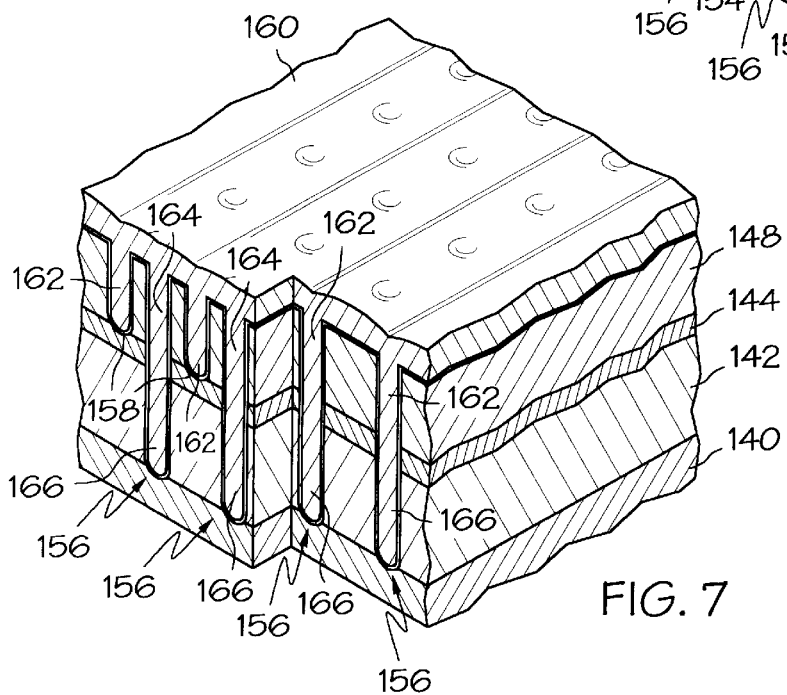
Figure 8:
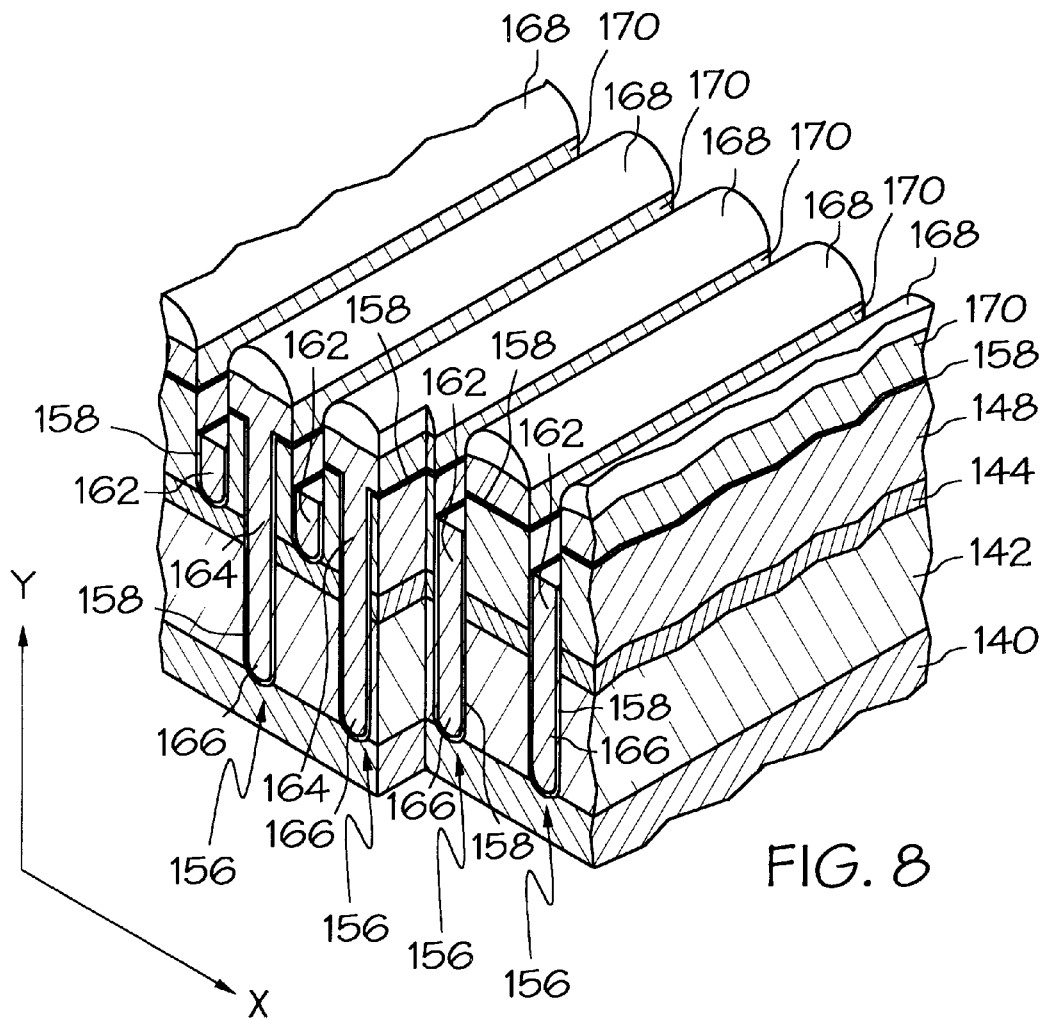

A highly selective etch is performed to form the alternating trenches 150 and contact openings 152. The etch stops on the nitride layer 144; however, where the nitride layer 144 was previously etched to form the openings 146, the etch continues through the insulation layer 142 to form plug openings 154 to contact locations 156 on the semiconductor structure 140. If necessary, a barrier layer 158, such as titanium or tinitride, is formed in the trench openings 150, the openings 146 through the nitride layer 144 and the plug openings 154 as shown in FIGS. 7 and 8.

A conductive layer 160 is then formed over the barrier layer 158 to fill the trench openings 150, the openings 146 through the nitride layer 144 and the plug openings 154. If the barrier layer 158 is not formed, the conductive layer 160 also fills the area illustrated as the barrier layer 160. The conductive layer 160 can be formed of CVD tungsten, CVD copper, CVD aluminum or other appropriate conductive material can be deposited or sputtered as will be apparent to those skilled in the art. The conductive layer 160 fills the trench openings 150 to form ribs 162 therein, fills the contact openings 152 to form conductive contacts 164 therein and fills the openings 146 and the plug openings 154 to form contact plugs 166 therein.

A photo resist pattern 168 is formed to define conductive contact lines 170 with each of the contact lines 170 covering and interconnecting a series of the conductive contacts 164. The portions of the conductive layer 160 not covered by the photo resist pattern 168 and corresponding portions of the barrier layer 158, if present, and insulation layer 148 are etched below the surface of the insulation layer 148 to isolate the ribs 162 from one another, from the contact lines 170 and from the contacts 164.

The etching operation is performed to a depth to reduce capacitive coupling between the ribs 162 and the contact lines 170 but to maintain sufficiently low resistances for the ribs 162. Capacitive coupling is reduced by alternating the ribs 162 with the contact lines 170 and contacts 164, and etching the ribs 162 to a level below the surface of the insulation layer 148. In this way, the ribs 162 and the contact lines 170 are separated from one another both vertically, the y-direction as shown in FIG. 8, and horizontally, the x-direction as shown in FIG. 8, and are substantially orthogonal to one another reducing adjacent surface areas and increasing the spacing between adjacent surface areas.

Having thus described the invention of the present application in detail and by reference to preferred embodiments thereof, it will be apparent that modifications and variations are possible without departing from the scope of the invention defined in the appended claims.

What is claimed is:

1. A method for forming contact to a semiconductor structure comprising the steps of:
    forming an insulation layer over said semiconductor structure;
    masking said insulation layer to form a patterned insulation layer having trench patterns and contact patterns aligned with locations of said semiconductor structure to be contacted, said trench patterns alternating with said contact patterns such that said trench patterns are separated from one another by at least one of said contact patterns;
    etching said patterned insulation layer to form alternating trench openings and contact openings;
    forming a conductive layer over said etched insulation layer to form alternating conductive ribs and conductive contacts;
    masking said conductive layer to form a patterned conductive layer defining contact lines covering said contacts; and
    etching between said contact lines to isolate said ribs from one another and from said contact lines.

2. A method for forming contact to a semiconductor structure as claimed in claim 1 wherein said step of etching between said contact lines comprises the step of etching to a depth to reduce capacitive coupling between said ribs and said contact lines but to maintain sufficiently low resistances for said conductive ribs.

3. A method for forming contact to a semiconductor structure as claimed in claim 1 further comprising the step of forming a barrier layer before forming said conductive layer.

4. A method for forming contact to a semiconductor structure comprising the steps of:
    forming a first insulation layer over said semiconductor structure;
    masking said first insulation layer;
    etching said first insulation layer to form openings corresponding to said mask through said first insulation layer;
    forming a first conductive layer over said first insulation layer filling said openings with conductive material;
    planarizing said first conductive layer;
    forming a second insulation layer over said first insulation layer;
    masking said second, insulation layer;
    etching said second insulation layer to form a series of trench openings and contact openings, said series of trench openings being separated from one another by series of contact openings;
    forming a second conductive layer over said second insulation layer filling said trench openings and contact openings with conductive material;
    masking said second conductive layer to define patterned columns of filled contact openings; and
    etching between said patterned columns to isolate said filled trench openings from said patterned columns.

5. A method for forming contact to a semiconductor structure comprising the steps of:
    forming conductive ribs over said semiconductor structure and aligned with first locations of said semiconductor structure to be contacted;
    forming conductive contacts over said semiconductor structure and aligned with second locations of said semiconductor structure to be contacted, said conductive ribs being separated from one another by at least one of said series of conductive contacts; and
    forming conductive contact lines over said conductive contacts, each of said conductive contact lines being connected to at least one of said conductive contacts and said conductive ribs being isolated from said conductive contact lines.

6. A method for forming contact to a semiconductor structure as claimed in claim 5 wherein each of said conductive contact lines is connected to a plurality of said series of conductive contacts.

7. A method for forming contact to a semiconductor structure as claimed in claim 6 wherein said conductive ribs and said conductive contact lines are substantially parallel to one another.

8. A method for forming contact to a semiconductor structure comprising the steps of:
    forming conductive ribs over said semiconductor structure in alignment with first locations of said semiconductor structure to be contacted;
    forming conductive contact lines over said semiconductor structure in alignment with second locations of said semiconductor structure;
    connecting said contact lines to said semiconductor structure by conductive contacts;
    interleaving said conductive ribs and said conductive contact lines with one another; and
    isolating said conductive ribs and said conductive contact lines from one another.

9. A method for forming contact to a semiconductor structure as claimed in claim 8 wherein said step of isolating said conductive ribs from said conductive contact lines comprises the step of spacing said conductive ribs from said conductive contact lines both vertically and horizontally.

10. A method for forming contact to a semiconductor structure comprising the steps of:

forming a plurality of conductive ribs over said semiconductor structure;

forming a plurality of conductive contact lines over said semiconductor structure, each of said contact lines being located between two of said conductive ribs and having a series of discrete conductive contacts extending to said semiconductor structure; and isolating said plurality of conductive ribs from one another and from said conductive contact lines.

11. A method for forming contact to a semiconductor structure as claimed in claim 10 wherein said step of isolating said plurality of conductive ribs from one another and from said conductive contact lines comprises the step of spacing said conductive ribs from said conductive contact lines in two dimensions.

12. A method for forming contact to a semiconductor structure as claimed in claim 10 wherein said step of isolating said plurality of conductive ribs from one another and from said conductive contact lines comprises the step of reducing heights of said conductive ribs to less than heights of said conductive contact lines.

13. A method for forming contact to a semiconductor structure comprising the steps of:

forming a plurality of conductive ribs over said semiconductor structure, said conductive ribs extending a first dimension above said semiconductor structure; and forming a plurality of conductive contact lines over said semiconductor structure, said contact lines extending a second dimension greater than said first dimension above said semiconductor structure, each of said contact lines being located between two of said conductive ribs and having a series of discrete conductive contacts extending therefrom to said semiconductor structure.

14. A method for forming contact to a semiconductor structure comprising the steps of:

forming a plurality of conductive ribs over said semiconductor structure, said conductive ribs extending a first dimension above said semiconductor structure; and forming a plurality of conductive contact lines over said semiconductor structure, said contact lines extending a second dimension greater than said first dimension above said semiconductor structure, said contact lines alternating with said conductive ribs and having a series of discrete conductive contacts extending therefrom to said semiconductor structure.

15. A method for forming contact to a semiconductor structure comprising the steps of:

forming a first insulation layer over said semiconductor structure;

forming a patterned mask over said first insulation layer, said patterned mask having openings corresponding to locations of said semiconductor structure to be contacted;

forming a second insulation layer over said patterned mask;

masking said second insulation layer to having trench patterns and contact patterns aligned with locations of said openings of said patterned mask;

etching said second insulation layer to form a series of trench openings and contact openings, each pair of said trench openings being separated from one another by contact openings;

etching said first insulation layer through said patterned mask to form plug openings to said semiconductor structure;

forming a conductive layer over said second insulation layer to fill said trench openings, said contact openings and said plug openings with conductive material;

masking said conductive layer to define patterned columns of filled contact openings; and etching between said patterned columns to isolate said filled trench openings from said patterned columns.

16. A method for forming contact to a semiconductor structure as claimed in claim 15 further comprising the step of forming said patterned mask of nitride.

17. A method for forming contact to a semiconductor structure comprising the steps of:

forming a first insulation layer over said semiconductor structure;

forming a patterned mask having first and second layers over said first insulation layer, said first layer having openings corresponding to locations of said semiconductor structure to be contacted and said second layer having trench patterns and contact patterns aligned with locations of said openings of said first layer;

etching said first layer of said patterned mask to form a series of trench openings and contact openings, each pair of said trench openings being separated from one another by contact openings;

etching said first insulation layer through said second layer of said patterned mask to form plug openings to said semiconductor structure;

forming a conductive layer over said two layer patterned mask to fill said trench openings, said contact openings and said plug openings with conductive material;

masking said conductive layer to define patterned columns of filled contact openings; and etching between said patterned columns to isolate said filled trench openings from said patterned columns.

18. A method for forming contact to a semiconductor structure as claimed in claim 17 further comprising the steps of:

forming said first layer of said patterned mask of nitride; and forming said second layer of said patterned mask of oxide.

19. A semiconductor circuit comprising:

a semiconductor structure;

a first insulation layer formed over said semiconductor structure;

a plurality of conductive plugs extending through said first insulation layer and corresponding to contact locations on said semiconductor structure;

a second insulation layer formed over said first insulation layer;

a plurality of conductive ribs extending partially through said second insulation layer and coupled to first ones of said conductive plugs;

a plurality of conductive contacts extending through said second insulation layer and coupled to second ones of said plurality of conductive plugs, at least one of said plurality of conductive plugs positioned within a plane that is interposed between adjacent ones of said conductive ribs; and conductive contact lines extending over said second insulation layer and coupled to said conductive contacts.

20. A semiconductor circuit as claimed in claim 19 wherein said conductive ribs and said conductive contacts are coupled to said conductive plugs through a barrier layer.

21. A semiconductor circuit as claimed in claim 19 wherein said conductive ribs and said conductive contact lines are substantially orthogonal to one another.

22. A semiconductor circuit as claimed in claim 19 wherein said plurality of conductive ribs are recessed below an upper surface of said second insulation layer.

23. A semiconductor circuit comprising:

a semiconductor structure;

an insulation layer formed over said semiconductor structure;

a plurality of conductive plugs extending from contact locations on said semiconductor structure into said insulation layer;

a plurality of conductive ribs extending from first ones of said conductive plugs toward an outer surface of said insulation layer;

a plurality of contacts extending from second ones of said conductive plugs to said outer surface of said insulation layer, said conductive ribs alternating with said contacts so that at least one of said contacts is interposed between adjacent ones of said ribs; and a plurality of contact lines on said outer surface of said insulation layer connecting said contacts, each of said contact lines connecting contacts between respective adjacent ones of said ribs.

24. A semiconductor circuit as claimed in claim 23 further comprising a patterned mask embedded within said insulation layer.

25. A semiconductor circuit as claimed in claim 24 wherein said insulation layer is oxide and said patterned mask is nitride.

26. A semiconductor circuit comprising:

a semiconductor structure;

a first insulation layer formed over said semiconductor structure;

a patterned mask formed over said first insulation layer, said patterned mask having openings corresponding to contact locations on said semiconductor structure;

a plurality of conductive plugs extending through said first insulation layer and said openings of said patterned mask;

a second insulation layer formed over said patterned mask;

a plurality of conductive ribs extending partially through said second insulation layer and connected to first ones of said conductive plugs;

a plurality of conductive contacts extending through said second insulation layer and connected to second ones of said conductive plugs, at least one of said plurality of conductive plugs positioned within a plane that is interposed between adjacent ones of said conductive ribs; and conductive contact lines extending over said second insulation layer and coupled to said conductive contacts.

* * * * *